United States Patent
Huang et al.

(10) Patent No.: US 9,065,324 B2
(45) Date of Patent: Jun. 23, 2015

(54) ELECTRONIC DEVICE WITH PVT DELAY COMPENSATION AND RELATED METHOD

(71) Applicant: Taiwan Semiconductor Manufacturing Company, Ltd., Hsin-Chu (TW)

(72) Inventors: Yi-Cheng Huang, Hsin-Chu (TW); Shang-Hsuan Liu, Zhudong Town (TW); Chou-Ying Yang, Hsin-Chu (TW); Wei Kei Chang, Zhubei (TW); Hsin-Chang Feng, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 14/061,446

(22) Filed: Oct. 23, 2013

(65) Prior Publication Data

US 2015/0109049 A1    Apr. 23, 2015

(51) Int. Cl.
*H03K 3/011* (2006.01)
*H02M 3/06* (2006.01)

(52) U.S. Cl.
CPC ....................................... *H02M 3/06* (2013.01)

(58) Field of Classification Search
None
See application file for complete search history.

(56) References Cited

U.S. PATENT DOCUMENTS

| | | | | |
|---|---|---|---|---|
| 4,746,823 A * | 5/1988 | Lee | ................................ | 327/262 |
| 5,793,238 A * | 8/1998 | Baker | ........................... | 327/262 |
| 6,150,862 A * | 11/2000 | Vikinski | ....................... | 327/262 |
| 6,320,443 B1 | 11/2001 | Jeong | | |
| 6,417,727 B1 * | 7/2002 | Davis | ........................... | 327/553 |
| 6,686,809 B2 * | 2/2004 | Nystrom et al. | ............. | 333/17.1 |
| 6,839,296 B2 | 1/2005 | Lee et al. | | |
| 7,190,213 B2 * | 3/2007 | Rotchford et al. | ............ | 327/551 |
| 7,286,022 B2 * | 10/2007 | Park et al. | ...................... | 331/135 |

* cited by examiner

*Primary Examiner* — Lincoln Donavan
*Assistant Examiner* — Terry L Englund
(74) *Attorney, Agent, or Firm* — Slater & Matsil, L.L.P.

(57) ABSTRACT

An electronic device includes a first circuit, and a delay circuit electrically connected to the first circuit. The delay circuit includes a resistor, a capacitor, and a process, voltage or temperature (PVT) compensation circuit electrically connected to the capacitor.

18 Claims, 5 Drawing Sheets

ELECTRONIC DEVICE WITH PVT DELAY COMPENSATION AND RELATED METHOD

BACKGROUND

Resistor-capacitor (RC) delay circuits are used in electronic circuits to control delay time of signals (e.g., to maintain various timings of memory circuits). The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). Shrinking of process dimensions can increase sensitivity of integrated circuits, such as the RC delay circuits or memory circuits, to process, voltage, and temperature (PVT) variation.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely RC delay circuits for memory applications. Other embodiments may also be applied, however, to other types of integrated circuit applications.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, novel RC delay circuits with PVT compensation are introduced. The RC delay circuits use a PVT-dependent circuit or component to narrow delay variation. As a result, lower margin is needed to cover the delay variation, enabling faster speeds in a circuit connected to the RC delay circuits. For example, a memory circuit may use faster read timings due to reduced delay variation in the RC delay circuits. The RC delay circuits may be applied in various circuit areas, including, but not limited to, memory circuits, processing circuits, controller circuits, image sensors, and the like. The RC delay circuits may be applied in various final products, including, but not limited to, feature phones, smartphones, tablet computers, personal computers, digital cameras, other consumer electronics, industrial electronics, automotive electronics, and the like.

Figure 1:
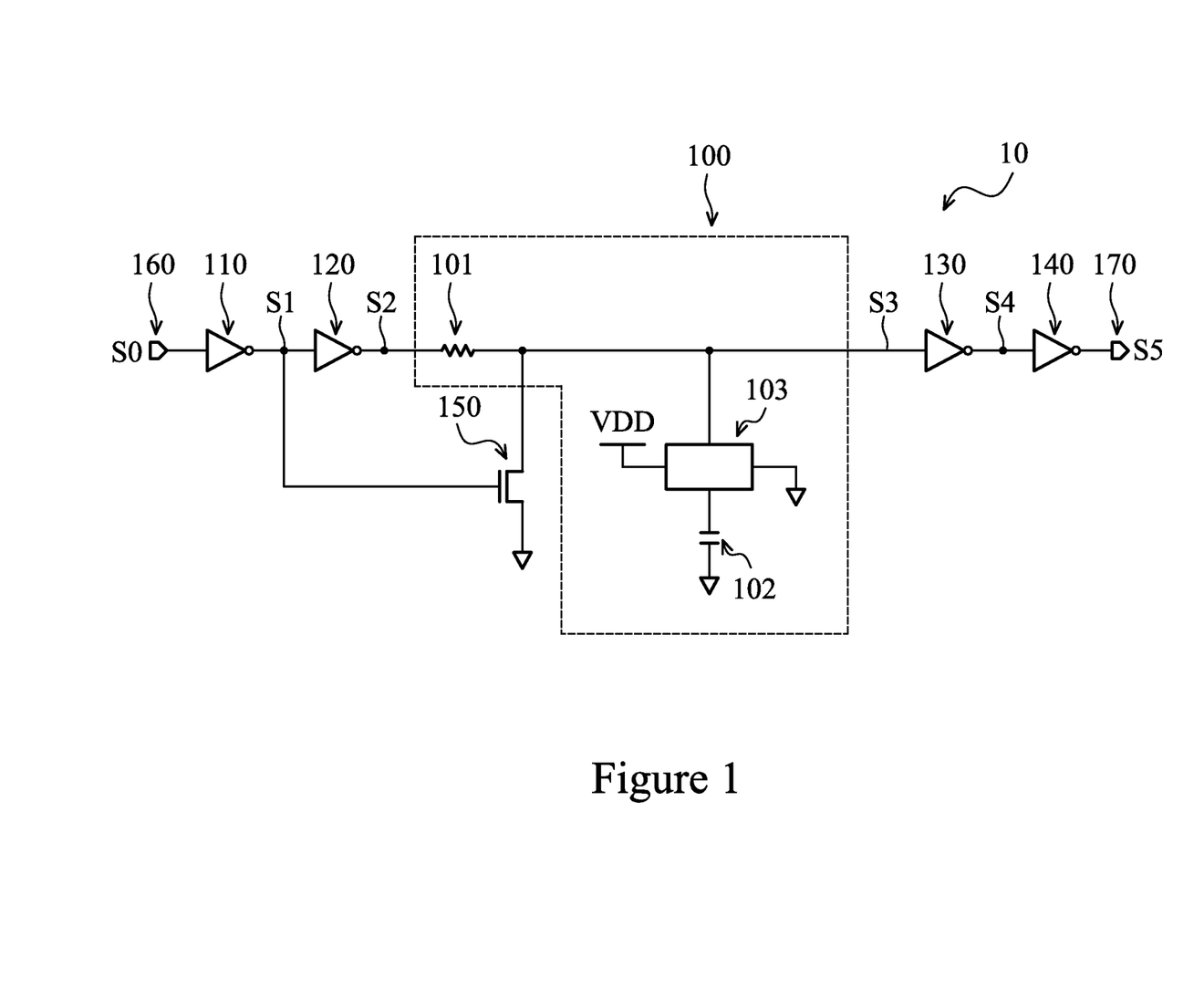
FIG. 1 is a diagram of an RC delay circuit in accordance with various embodiments of the present disclosure.

FIG. 1 is a diagram of an RC delay circuit 10 in accordance with various embodiments of the present disclosure. A PVT-compensated resistor-capacitor circuit 100 (or simply "RC circuit 100") is bracketed by two pair of inverters 110, 120 and 130, 140 (or "first inverter 110," "second inverter 120," "third inverter 130," and "fourth inverter 140"). Input node 160 receives an input signal S0, and an output node 170 outputs an output signal S5. In some embodiments, the output signal is a processed version of the input signal, where processing is accomplished in whole or in part by the RC delay circuit 10. The processing includes adding signal delay, and may also include filtering, attenuation, amplification, and the like.

The first inverter 110 receives the input signal S0 at an input terminal of the first inverter 110 coupled to the input node 160, and inverts the input signal S0 to generate a first inverted signal S1 at an output terminal of the first inverter 110. An input terminal of the second inverter 120 is electrically connected to the output terminal of the first inverter 110. The first inverted signal S1 is received by the second inverter 120 at the input terminal thereof, and inverted by the second inverter 120 to generate a second inverted signal S2 at an output terminal of the second inverter 120. In some embodiments, voltage level of the second inverted signal S2 is substantially equal to voltage level of the input signal S0. In some embodiments, the first and second inverters 110, 120 function as buffers in the RC delay circuit 10. In some embodiments, the first and second inverters 110, 120 are not included in the RC delay circuit 10.

A resistor 101 of the RC circuit 100 has a first terminal electrically connected to the output terminal of the second inverter 120. The resistor 101 receives the second inverted signal S2 at the first terminal of the resistor 101. In some embodiments, the resistor 101 is an integrated resistor, such as a polysilicon resistor, a diffusion resistor, or the like.

A capacitor 102 of the RC circuit 100 has a first electrode (e.g., "top plate") electrically connected to a second terminal of the resistor 101 through a PVT-dependent circuit 103 (or "PVT compensation circuit 103"). A second electrode (e.g., "bottom plate") of the capacitor 102 is electrically connected to a power supply node (e.g., ground). In some embodiments, the capacitor 102 is a metal-oxide-metal (MOM) capacitor, a metal-insulator-metal (MIM) capacitor, a polysilicon capacitor, a combination thereof, or the like.

The PVT-dependent circuit 103 is electrically connected to the second terminal of the resistor 101 and the first electrode of the capacitor 102. A first terminal of the PVT-dependent circuit 103 is electrically connected to the second terminal of the resistor 101, and a second terminal of the PVT-dependent circuit 103 is electrically connected to the first electrode of the capacitor 102. In some embodiments, the PVT-dependent circuit 103 is further electrically connected to a first power supply node (e.g., VDD) and a second power supply node (e.g., ground or VSS). In some embodiments, the PVT-dependent circuit 103 is a pass gate (transmission gate. In some embodiments, the PVT-dependent circuit 103 includes an N-type metal-oxide-semiconductor (NMOS) transistor having a gate electrode electrically connected to the first power supply node. The PVT-dependent circuit 103 may further include a P-type metal-oxide-semiconductor (PMOS) transistor having a gate electrode electrically connected to the second power supply node. A source electrode of the NMOS transistor and a drain electrode of the PMOS transistor are electrically connected to the first electrode of the capacitor 102. A drain electrode of the NMOS transistor and a source electrode of the PMOS transistor are electrically connected to the second electrode of the resistor 101. In some embodiments, the PVT-dependent circuit 103 is an NMOS transistor. In some embodiments, the PVT-dependent circuit 103 is a PMOS transistor. In some embodiments, the PVT-dependent circuit 103 is a current load biased by a PVT-dependent voltage. In some embodiments, the PVT-dependent voltage is generated by a bandgap voltage reference.

In some embodiments, the PVT-dependent circuit 103 is electrically connected differently from the configuration shown in FIG. 1. For example, in some embodiments, the first terminal of the PVT-dependent circuit 103 is electrically connected to the second electrode of the capacitor 102, and the second terminal of the PVT-dependent circuit 103 is electrically connected to the power supply node. In some embodiments, the first terminal of the PVT-dependent circuit 103 is electrically connected to the second terminal of the resistor 101, and the second terminal of the PVT-dependent circuit 103 is electrically connected to the input terminal of the third inverter 130. In some embodiments, the first terminal of the PVT-dependent circuit 103 is electrically connected to the second terminal of the resistor 101, and the second terminal of the PVT-dependent circuit 103 is electrically connected to the first terminal of the capacitor 102. In some embodiments, the first terminal of the PVT-dependent circuit 103 is electrically connected to the second terminal of the resistor 101, and the second terminal of the PVT-dependent circuit 103 is electrically connected to the input terminal of the third inverter 130.

A transistor 150 is a NMOS transistor in some embodiments. A gate electrode of the transistor 150 is electrically connected to the output terminal of the first inverter 110 and the input terminal of the second inverter 120. A drain electrode of the transistor 150 is electrically connected to the second terminal of the resistor 101 and the first electrode of the capacitor 102 (through the PVT-dependent circuit 103). A source electrode of the transistor 150 is electrically connected to the second power supply node (e.g., ground). The transistor 150 turns on when the first inverted signal S1 has voltage level above a threshold voltage of the transistor 150, such as when the first inverted signal S1 is logic high. Turning on the transistor 150 assists pulling down of voltage at an input terminal of the third inverter 130 when the input signal S0 is logic low.

The RC circuit 100 outputs a delayed signal S3. The delayed signal S3 is a version of the second inverted signal S2 delayed in time by charging of the capacitor 102 through the resistor 101 and the PVT-dependent circuit 103. Length of delay caused by the RC circuit 100 is less variable due to compensation provided by the PVT-dependent circuit 103, as opposed to configurations that do not include the PVT-dependent circuit 103. PVT dependency of the PVT-dependent circuit 103 tracks PVT dependency of a circuit including the inverters 110, 120, 130, 140, the transistor 150, the resistor 101 and the capacitor 102. Experimental results indicate that the PVT dependency is dominated by the second inverter 120 and third inverter 130. PVT skew causes a reduction in charging current provided by the second inverter 120, while also causing an increase in equivalent resistance of the PVT-dependent circuit 103. As a result, the larger resistance of the PVT-dependent circuit 103 blocks more capacitance seen by the second inverter 120.

The delayed signal S3 is received at the input terminal of the third inverter 130. The third inverter 130 inverts the delayed signal S3 to generate a first inverted delayed signal S4 at an output terminal of the third inverter 130. An input terminal of the fourth inverter 140 is electrically connected to the output terminal of the third inverter 130. The first inverted delayed signal S4 is received by the input terminal of the fourth inverter 140, and inverted by the fourth inverter 140 to generate the output signal S5 at an output terminal of the fourth inverter 140. The output terminal of the fourth inverter 140 is electrically connected to the output node 170.

Figure 3:
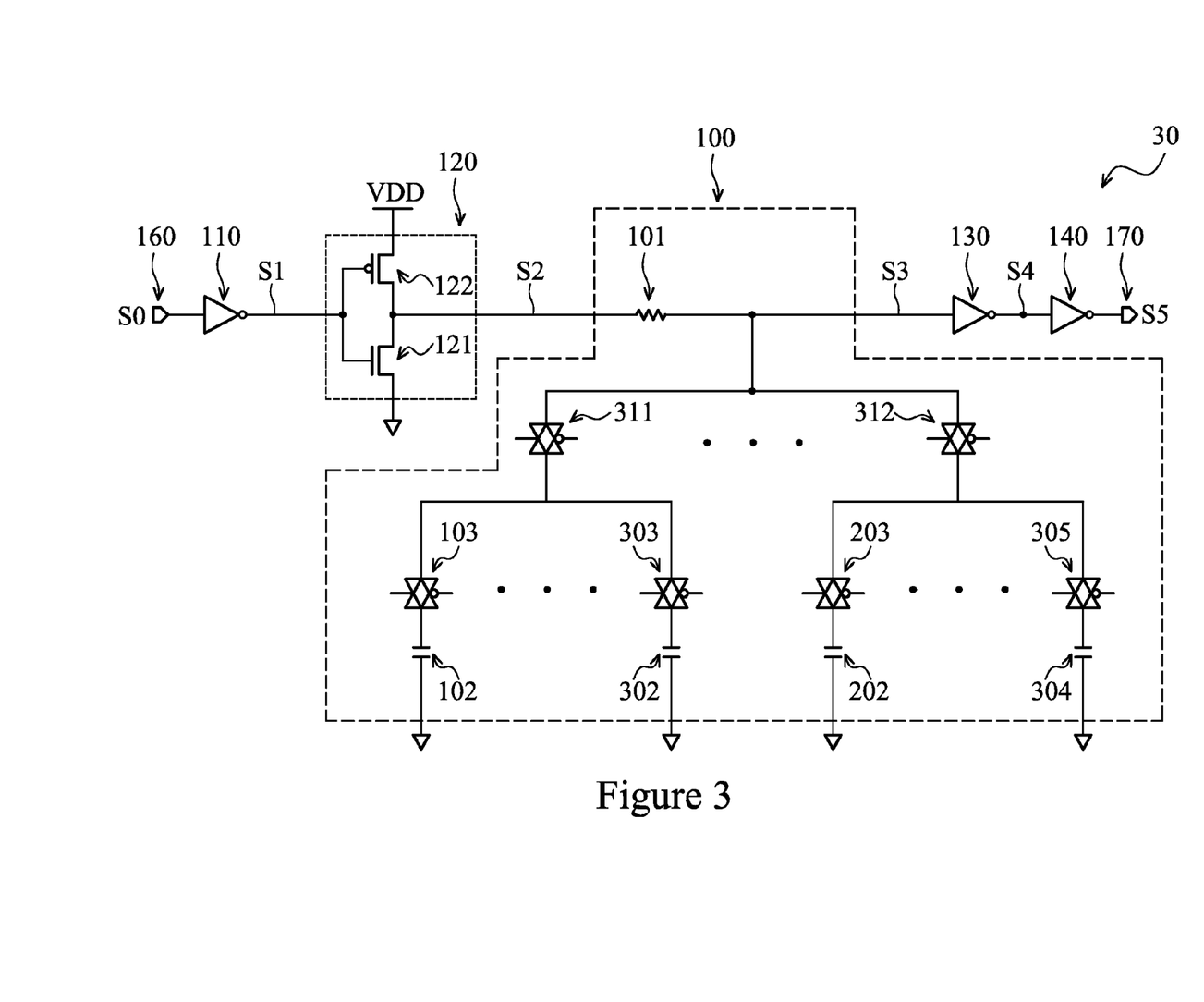
FIG. 3 is a diagram of an RC delay circuit with capacitors arranged in a column hierarchy in accordance with various embodiments of the present disclosure.

Each of the inverters 110, 120, 130, 140 may include an N-type transistor and a P-type transistor. A detailed circuit diagram of one of the inverters 120 is shown in FIG. 3. A PMOS transistor 122 has a gate electrode electrically connected to a gate electrode of an NMOS transistor 121. A drain electrode of the PMOS transistor 122 is electrically connected to a drain electrode of the NMOS transistor 121. A source electrode of the PMOS transistor 122 is electrically connected to the first power supply node. A source electrode of the NMOS transistor 121 is electrically connected to the second power supply node. Each of the inverters 110, 130, 140 may have similar structure to the inverter 120 shown in FIG. 3. In some embodiments, the first terminal of the PVT-dependent circuit 103 is electrically connected to the first power supply node, and the second terminal of the PVT-dependent circuit 103 is electrically connected to the source electrode of the PMOS transistor 122.

Figure 2:
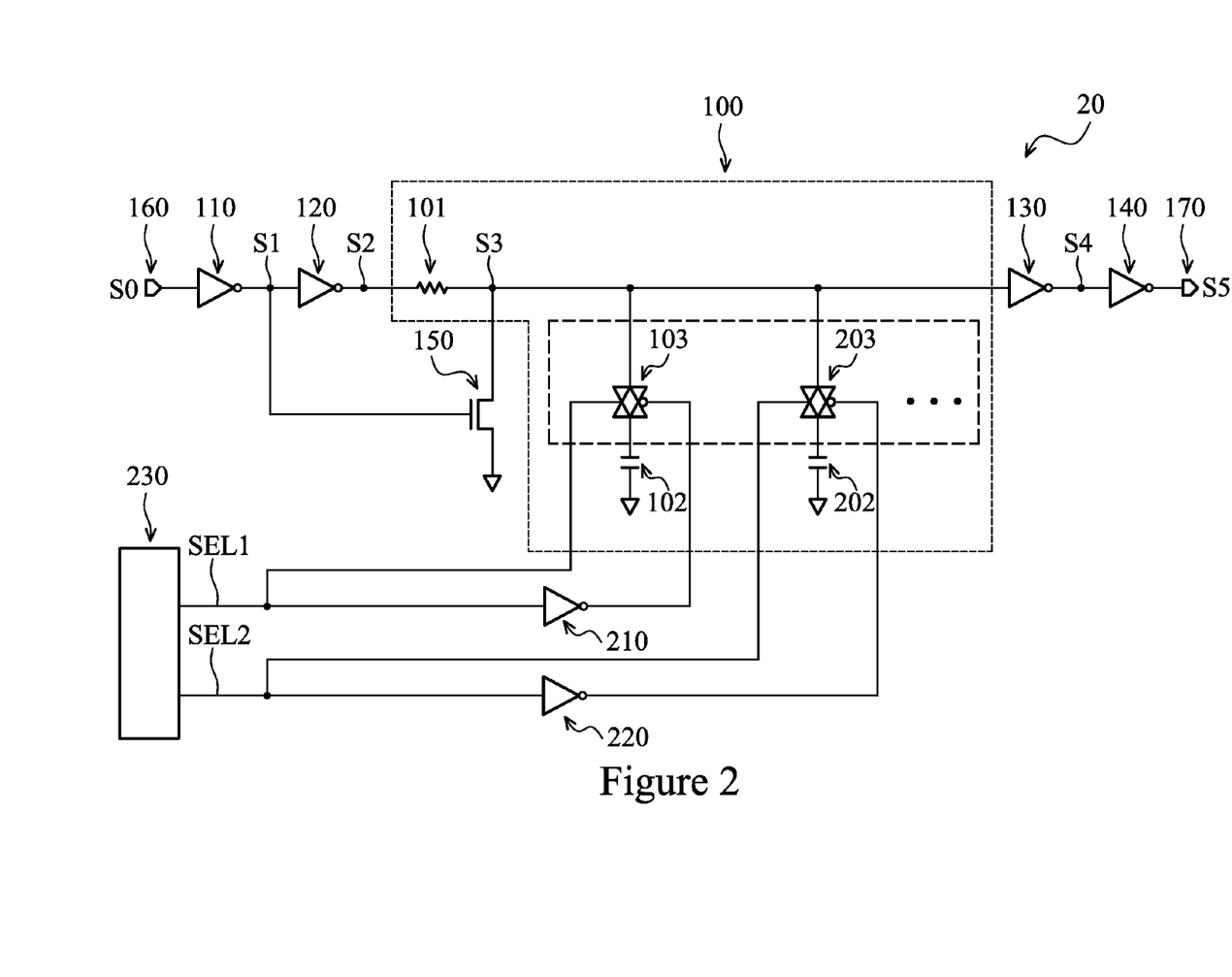
FIG. 2 is a diagram of an RC delay circuit with multiple capacitors in accordance with various embodiments of the present disclosure.

In some embodiments, the RC circuit 100 may include more than one capacitor (e.g., a capacitor array) controllable through a selection circuit (e.g., a multiplexer, decoder, or the like). FIG. 2 is a diagram of an RC delay circuit 20 with multiple capacitors in accordance with various embodiments of the present disclosure. The RC delay circuit 20 shares many similarities with the RC delay circuit 10 of FIG. 1, with like reference numbers referring to like components. In addition to the elements shown in FIG. 1, the RC delay circuit 20 further includes at least one additional capacitor 202 and corresponding PVT-dependent circuit 203 (or "PVT compensation circuit 203"). In some embodiments, the capacitor 202 has substantially equal capacitance to the capacitor 102. In some embodiments, the capacitor 202 has a multiple (e.g., 2×, 4×, or the like) of capacitance of the capacitor 102.

The RC delay circuit 20 also further includes at least two selection inverters 210, 220, and a selection circuit 230. In some embodiments, the selection circuit 230 is a multiplexer, decoder, or the like. The selection circuit 230 is electrically connected to the PVT-dependent circuits 103, 203. The selection circuit 230 outputs selection signals SEL1, SEL2 to the PVT-dependent circuits 103, 203 (or "transmission gates 103, 203"). In some embodiments, the PVT-dependent circuits 103, 203 are transmission gates. When the selection signal SEL1 has a logic high voltage (e.g., VDD), an N-type transistor of the transmission gate 103 is turned on. The selection inverter 210 inverts the logic high voltage to a logic low voltage (e.g., ground), and a P-type transistor of the transmission gate 103 electrically connected to the selection inverter 210 is also turned on. Similarly, the selection signal SEL2 having the logic high voltage turns on an N-type transistor of the transmission gate 203, and turns on a P-type transistor of the transmission gate 203 through the selection inverter 220. Conversely, the selection signal SEL1 having the low logic voltage effectively turns off the N-type transistor of the transmission gate 103, and turns off the P-type transistor of the transmission gate 103 through the selection inverter 210. And, likewise, the selection signal SEL2 having the low logic voltage effectively turns off the N-type transistor of the transmission gate 203, and turns off the P-type transistor of the transmission gate 203 through the selection inverter 220. The transmission gates 103, 203 provide both capacitor switching and PVT compensation.

In some embodiments, multiple capacitors of the RC circuit 100 are organized in a column hierarchy. FIG. 3 is a diagram of an RC delay circuit 30 with capacitors 102, 302, 202, 304 arranged in a column hierarchy in accordance with various embodiments of the present disclosure. At least two columns are included in the RC circuit 100 shown in FIG. 3. Each column includes at least two of the capacitors 102, 302, 202, 304. A transmission gate 311 (or "PVT compensation circuit 311") controls a first column of the at least two columns. Another transmission gate 312 (or "PVT compensation circuit 312") controls another column of the at least two columns. The capacitors 102 and 302 are in the column controlled by the transmission gate 311. The capacitors 202 and 304 are in the column controlled by the transmission gate 312. In some embodiments, a greater number of columns than shown are included in the RC circuit 100. In some embodiments, a greater number of capacitors per column than shown are included in the RC circuit 100.

Each capacitor of the capacitors 102, 302, 202, 304 is electrically connected to a corresponding transmission gate. As described above, the first electrode of the capacitor 102 is electrically connected to the transmission gate 103. A first electrode of the capacitor 302 is electrically connected to a transmission gate 303 (or "PVT compensation circuit 303"). The transmission gates 103, 303 are electrically connected to the transmission gate 311. The transmission gate 311 is electrically connected to the second terminal of the resistor 101.

As described above, the first electrode of the capacitor 202 is electrically connected to the transmission gate 203. A first electrode of the capacitor 304 is electrically connected to a transmission gate 305 (or "PVT compensation circuit 305"). The transmission gates 203, 305 are electrically connected to the transmission gate 312. The transmission gate 312 is electrically connected to the second terminal of the resistor 101. Second electrodes of the capacitors 102, 302, 202, 304 are electrically connected to the second power supply node (e.g., ground).

To select the capacitor 302, the transmission gates 311 and 303 are turned on. To select the capacitor 304, the transmission gates 312 and 305 are turned on. Selection of one or more capacitors of the capacitors 102, 302, 202, 304 is performed by simultaneously turning on the corresponding transmission gates. The transmission gates 311, 312, 103, 303, 203, 305 both select capacitors and compensate for process, voltage and temperature variation. In some embodiments, the transmission gates 311, 312, 103, 303, 203, 305 are controlled by at least one selection circuit similar to the selection circuit 230 of FIG. 2.

Figure 4:
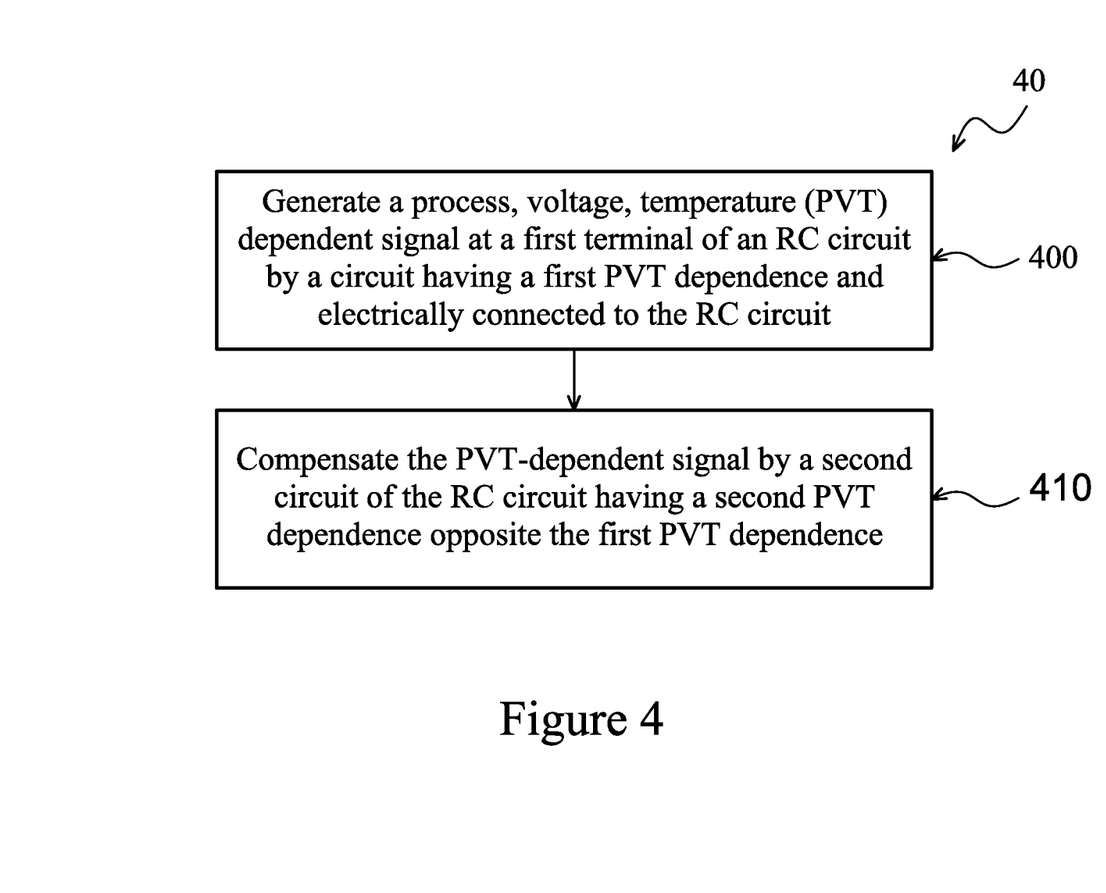
FIG. 4 is a flowchart of a process for performing PVT compensation in accordance with various embodiments of the present disclosure.
Figure 5:
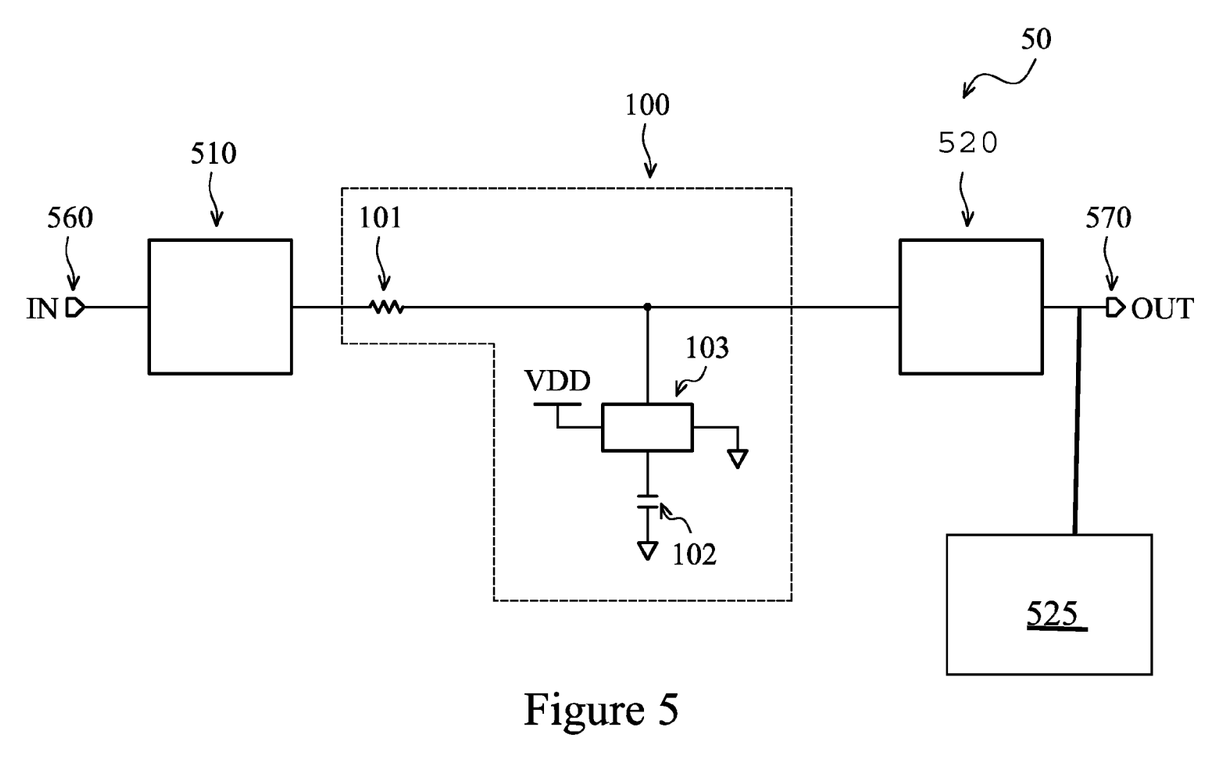
FIG. 5 is a circuit diagram of an electronic device in accordance with various embodiments of the present disclosure.

FIG. 4 is a flowchart of a process 40 for performing PVT compensation in accordance with various embodiments of the present disclosure. FIG. 5 is a circuit diagram of an electronic device 50 in accordance with various embodiments of the present disclosure. The electronic device 50 includes the RC circuit 100, as well as a first circuit 510 electrically connected to an input terminal of the RC circuit 100, and a second circuit 520 electrically connected to an output terminal of the RC circuit 100. In some embodiments, the first circuit 510 introduces PVT-dependent delay variation into an output signal OUT of the electronic device 50. In some embodiments, the second circuit 520 introduces PVT-dependent delay variation into the output signal OUT of the electronic device 50. In some embodiments, the first circuit 510 and the second circuit 520 introduce PVT-dependent delay variation into the output signal OUT of the electronic device 50.

In some embodiments, the PVT-dependent circuit 103 cancels out the PVT-dependent delay variation. In some embodiments, the PVT-dependent circuit 103 reduces the PVT-dependent delay variation.

The process 40 is compatible with the RC delay circuits 10, 20, 30 shown in FIGS. 1-3, as well as the electronic device 50 shown in FIG. 5. A PVT-dependent signal is generated at the first terminal of the RC circuit 100 by a circuit having a first PVT dependence in operation 400. In some embodiments, the circuit is the first circuit 510. In some embodiments, the first circuit 510 includes at least the inverters 110, 120. In some embodiments, the circuit is the second circuit 520. In some embodiments, the second circuit 520 includes the inverters 130, 140. In some embodiments, the circuit includes a circuit external to the RC delay circuit 10, 20, or 30. In some embodiments, the PVT-dependent signal has process, voltage, or temperature variation. In some embodiments, the process, voltage or temperature variation is associated with delay of the RC delay circuit 10, 20, or 30. In some embodiments, the process, voltage or temperature variation increases the delay of the RC delay circuit 10, 20, or 30. In some other embodiments, the process, voltage, or temperature variation reduces the delay of the RC delay circuit 10, 20, or 30. FIG. 5 also shows a representative input node 560 and representative output node 570.

In some embodiments, the first PVT dependence of the first circuit signal is associated with process, voltage, or temperature variation. In some embodiments, the first PVT dependence is associated with the delay of the RC delay circuit 10, 20, or 30. In some embodiments, the first PVT dependence increases the delay of the RC delay circuit 10, 20, or 30. In some other embodiments, the first PVT dependence reduces the delay of the RC delay circuit 10, 20, or 30.

A second circuit of the RC circuit 100 compensates the PVT-dependent signal in operation 410 to generate a compensated PVT-dependent signal. In some embodiments, the second circuit has a second PVT dependence tracking the first PVT dependence. In some embodiments, the second circuit is a single transmission gate (e.g., the transmission gate 103, or the transmission gate 203). In some embodiments, the second circuit includes multiple transmission gates (e.g., the transmission gates 103 and 311, the transmission gates 303 and 311, the transmission gates 203 and 312, or the transmission gates 305 and 312).

In some embodiments, following the operating 410, the compensated PVT-dependent signal is inverted (e.g., by the third inverter 130) to generate an inverted compensated PVT-dependent signal. In some embodiments, the inverted compensated PVT-dependent signal is further inverted to generate an output signal (e.g., an output signal OUT shown in FIG. 5, or the output signal S5). In some embodiments, the output signal controls a memory circuit 525 electrically connected to the electronic device 50 or the RC delay circuit 10, 20 or 30.

Embodiments may achieve advantages. The RC delay circuits 10, 20, 30 and the electronic device 50 include PVT-dependent circuits that compensate for PVT variation, and tighten variability of the RC delay provided. This allows for increased speeds in the electronic device 50 or in electronic circuits electrically connected to the RC delay circuits 10, 20, 30. In one example, memory timings can be sped up due to the tighter variation in the RC delay of the RC delay circuits 10, 20, 30 or the electronic device 50.

In accordance with various embodiments of the present disclosure, an electronic device comprises a first circuit, and a delay circuit electrically connected to the first circuit. The delay circuit comprises a resistor, a capacitor, and a process, voltage or temperature (PVT) compensation circuit electrically connected to the capacitor.

In accordance with various embodiments of the present disclosure, a method comprises generating a process, voltage or temperature (PVT) dependent signal at a first terminal of a resistor-capacitor (RC) circuit by a circuit having a first PVT dependence and electrically connected to the RC circuit; and compensating the PVT dependent signal by a second circuit of the RC circuit to generate a compensated PVT dependent signal, the second circuit having a second PVT dependence opposite the first PVT dependence.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device comprising:
a first circuit; and
a delay circuit electrically connected to the first circuit, the delay circuit comprising:
  a resistor;
  a capacitor;
  a process, voltage or temperature (PVT) compensation circuit electrically connected to the capacitor;
  at least one second capacitor;
  at least one second PVT compensation circuit, the at least one second PVT compensation circuit electrically connected to the at least one second capacitor; and
  at least one third PVT compensation circuit, the at least one third PVT compensation circuit electrically connecting the PVT compensation circuit and the at least one second PVT compensation circuit to the resistor.

2. The electronic device of claim 1, wherein:
the resistor has a first terminal electrically connected to the first circuit;
the PVT compensation circuit has a first terminal electrically connected to a second terminal of the resistor through the at least one third PVT compensation circuit; and
the capacitor has a first electrode electrically connected to a second terminal of the PVT compensation circuit.

3. The electronic device of claim 2, wherein the PVT compensation circuit is a transmission gate.

4. The electronic device of claim 1, wherein the first circuit comprises:
a first inverter having an input terminal electrically connected to an input node of the electronic device, and an output terminal; and
a second inverter having an input terminal electrically connected to the output terminal of the first inverter, and an output terminal electrically connected to a first terminal of the resistor.

5. The electronic device of claim 4, further comprising a transistor having:
a gate electrode electrically connected to the output terminal of the first inverter;
a drain electrode electrically connected to a second terminal of the resistor; and
a source electrode electrically connected to a power supply node.

6. The electronic device of claim 4+, further comprising a second circuit comprising:
a third inverter having an input terminal electrically connected to a second terminal of the resistor; and
a fourth inverter having an input terminal electrically connected to an output terminal of the third inverter.

7. The electronic device of claim 1, further comprising a selection circuit electrically connected to the PVT compensation circuit and the at least one second PVT compensation circuit.

8. The electronic device of claim 1, wherein the PVT compensation circuit is an N-type metal-oxide-semiconductor (NMOS) transistor.

9. The electronic device of claim 1, further comprising two second PVT compensation circuits associated with the at least one third PVT compensation circuit.

10. The electronic device of claim 2, wherein the at least one third PVT compensation circuit has a first terminal connected to the second terminal of the resistor and a second terminal connected to the at least one second PVT compensation circuit.

11. A method comprising:
generating a process, voltage or temperature (PVT) dependent signal at a first terminal of a resistor-capacitor (RC) circuit by a circuit having a first PVT dependence and electrically connected to the RC circuit; and
compensating the PVT dependent signal by a second circuit of the RC circuit to generate a compensated PVT dependent signal, the second circuit having a second PVT dependence tracking the first PVT dependence, wherein the compensating is performed by selecting at least two transmission gates of a plurality of transmission gates of a column hierarchy of the RC circuit.

12. The method of claim 11, wherein the compensating is compensating the PVT dependent signal by an N-type metal-oxide-semiconductor (NMOS) of the RC circuit.

13. The method of claim 11, wherein the generating is generating the PVT dependent signal having a first delay variation.

14. The method of claim 13, wherein the compensating is reducing the first delay variation by a second delay variation of the second circuit.

15. The method of claim 11, wherein the generating is generating the PVT dependent signal by a first inverter and a second inverter of the circuit.

16. The method of claim 11, further comprising:
inverting the compensated PVT dependent signal to generate an inverted compensated PVT dependent signal; and
inverting the inverted compensated PVT dependent signal to generate an output signal.

17. The method of claim 16, further comprising:
controlling a memory circuit by the output signal.

18. The method of claim 11, further comprising receiving a selection signal for selecting the at least two transmission gates of the plurality of transmission gates of the column hierarchy of the RC circuit.

* * * * *